United States Patent [19]
Gerdes

[11] Patent Number: 5,021,786
[45] Date of Patent: Jun. 4, 1991

[54] ANALOG TO DIGITAL AND DIGITAL TO ANALOG SIGNAL PROCESSORS

[76] Inventor: Richard C. Gerdes, 4645 E. Quivira Dr., Tucson, Ariz. 85718

[21] Appl. No.: 408,086

[22] Filed: Sep. 15, 1989

[51] Int. Cl.$^5$ .............................................. H03M 3/00
[52] U.S. Cl. .................... 341/143; 341/110; 341/144; 341/166; 375/26
[58] Field of Search ............... 341/143, 118, 120, 131, 341/138, 155, 166, 144, 152, 110; 381/29, 31; 375/26, 27, 28, 30

[56] References Cited
U.S. PATENT DOCUMENTS

| | | | |
|---|---|---|---|
| 4,411,003 | 10/1983 | Su | 375/33 |
| 4,490,714 | 12/1984 | van de Plassche et al. | 341/118 |
| 4,507,791 | 3/1985 | Gundry | 375/27 |
| 4,700,362 | 10/1987 | Todd et al. | 375/30 |

OTHER PUBLICATIONS

1986 Analog Devices Data Acquisition Databook, pp. 2-64.
National Semiconductor ADC0820 8 Bit High speed A/D Conductor pp. 3-91.

Primary Examiner—A. D. Pellinen
Assistant Examiner—Brian K. Young
Attorney, Agent, or Firm—Spensley Horn Jubas & Lubitz

[57] ABSTRACT

Improved analog to digital and digital to analog signal processors are disclosed wherein a quick approximation of the input signal to the signal processor is attained and a more accurate approximation is later attained for the input signal. For the analog to digital conversion, a standard analog to digital converter having a finite resolution or a predetermined quantization error is used to create part of the digital representation. The remainder of digital representation is created by processing an error signal due to the finite resolution of a standard analog to digital converter and the infinite resolution of the analog input signal to a delta modulator. In a digital to analog signal processing circuit, the first part of the digital representation is converted by a standard digital to analog converter and the remaining portion is integrated into a frequency limited analog signal and then summed to reconstruct the analog signal. To avoid overshoot, the integrators of the signal processors are preset based upon the increase or the decrease in the first part. Further, the rate of integration is controlled so that the rate slows as the digital representation of the analog signal becomes increasingly more accurate representation of the input signal.

38 Claims, 6 Drawing Sheets

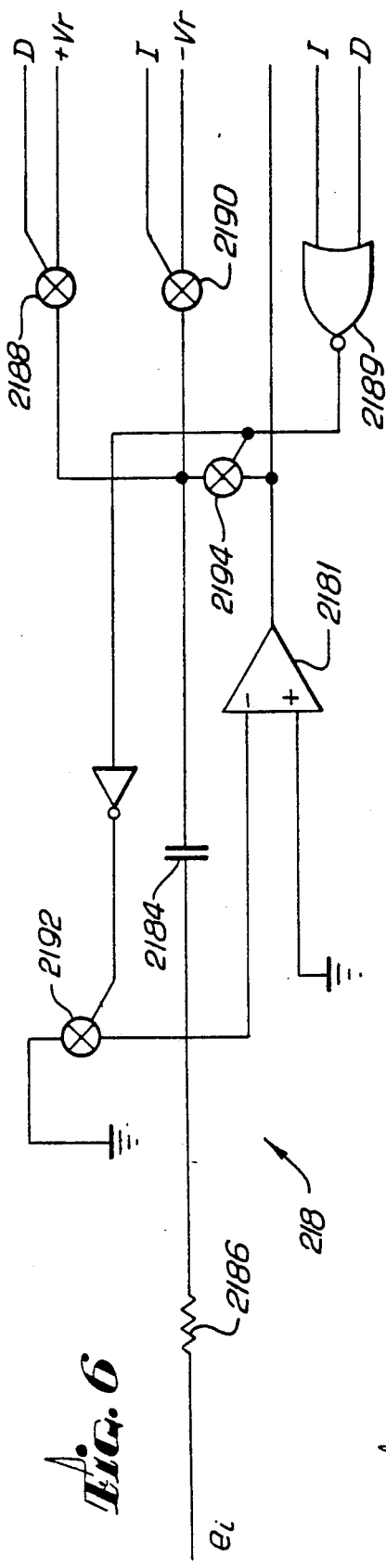
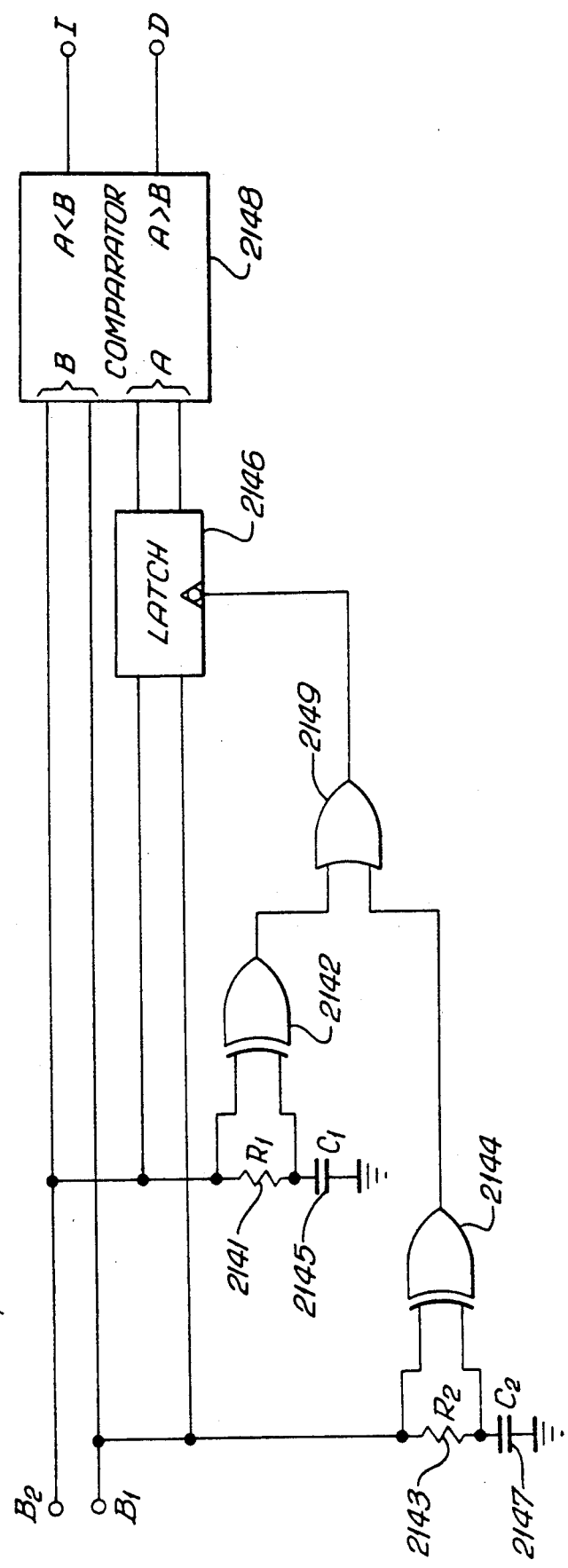
Fig. 6
Fig. 7

ANALOG TO DIGITAL AND DIGITAL TO ANALOG SIGNAL PROCESSORS

BACKGROUND OF THE INVENTION

1. Field of the Invention

This invention relates to improved analog to digital and digital to analog conversion techniques and more particularly to improved analog to digital and digital to analog conversion techniques using delta modulation.

2. Description of the Prior Art

Conversion of analog signals to digital data inherently involves different trade-offs. Most of these tradeoffs involve speed, quantization noise, dynamic range and cost.

For example, analog to digital conversion can involve either a serial process or a parallel process. Serial conversion frequently allows for a simpler and a less costly implementation but tends to be slower than parallel conversion.

A further consideration is the amount of noise that is permitted. The more bits that are used for quantifying the analog signals, the less quantization noise that will result from the conversion and the greater the dynamic range of the system. For example, using simple pulse code modulation (PCM), 128 separate levels as represented by 7 bits are required for a dynamic of 42 dB while 131,072 separate levels or 17 bits is required for a dynamic range greater than 100 dB.

Another way of expressing the noise problem is based upon the resolution of the digital to analog converter. A seven bit digital representation of a five volt input signal provides a resolution of 0.0391 volts (five volts divided by 128) ; i.e., the digital representation of the analog signal can only reflect changes greater than 0.0391 volts in the analog signal. However a 17 bit representation of the same signal can reflect changes greater than $3.81 \times 10^{-5}$ volts. Of course, the original analog input signal, theoretically has an infinite resolution.

Another problem common with many analog to digital and digital to analog converters is dithering. The analog to digital converter's switching circuitry introduces objectionable noise into the converted signal at low signal levels or with slowly changing signals. To avoid such noise, complicated dithering circuits such as those shown in U.S. Pat. No. 4,490,714 to van de Plassche have been used.

One digital to analog system that may have relatively high dynamic range and low quantization noise is a delta modulation system, which is a one bit output form of a PCM system. FIG. 1 represents the classic delta modulation system 10. An input analog signal $e_i$ signal is fed through a comparator 12 with the output signal $\epsilon$ of the comparator 12 representing which of the input signal $e_i$ and an output $e_t$ of an integrator 14 is greater. That output $\epsilon$ is modulated by a modulator 16 supplied with a periodic pulse train from a pulse generator 18. In effect, the modulator 16 samples the output $\epsilon$ of the comparator 12. The output of the modulator $e_o$ is fed back for integration by an integrator 14.

The result is that the output $e_o$ of the delta modulator 10 is a series of pulses. The pulses represent the rate of change of the signal amplitude from sampling instant to sampling instant.

A system 20 to reconstruct the original input signal $e_i$ is shown in FIG. 2. The output $e_o$ of the delta modulator is integrated by an integrator 22 and is then inputted to a low pass filter 24 to eliminate high frequency noise caused by the sampling or the modulation. Alternatively, a frequency limited integrator may be used.

To reduce noise in the system, a higher frequency for the pulse train can be used. Further, instead of using just one integrator in the modulator and demodulator, two integrators may be used. Further details regarding different types of delta modulators may be found in a variety of textbooks, including Philip F. Panther, *Modulation, Noise and Soectral Analysis* (1965).

However, delta modulators have several disadvantages. They are relatively slow in responding to rapid, large changes in the amplitude of the input signal. Further, delta modulators lose all D.C. information contained in the original analog signal. In addition, delta modulators have limited resolution.

Delta modulators also cause quantization noise in the resultant analog output signal upon conversion back to an analog signal. Commonly, such quantization noise can be avoided by dithering.

Therefore, it is a first object of this invention to provide a relatively simple analog to digital converter that provides high speed conversion with good resolution. It is a further object of this invention to avoid the use of dithering to remove quantization noise and to avoid the loss of DC signals. And it is a still further object of this invention to provide such a converter that is simple and that may be incorporated into one integrated circuit.

SUMMARY OF THE INVENTION

These and other objects are achieved by improved analog to digital and digital to analog signal processors. The disclosed analog to digital signal processors include a first converter of a predetermined resolution such as a standard parallel analog to digital converter that creates a partial digital representation of the analog signal. Due to the limited resolution of that converter, the converter's output has a quantization error.

The remaining portion of the digital representation is produced by a second converter of a greater resolution that converts the resultant quantization error due to the limited resolution of the first converter. That second converter is preferably a delta modulator.

Compatible digital to analog signal processors are also disclosed. To process such a digital representation back to an analog signal, the partial digital representation is converted to an analog signal by a digital to analog converter having the same resolution as the first converter. A second digital to analog converter processes the digital representation representative of the quantization error. The outputs of the two converters are then summed.

In a preferred disclosed embodiment of the disclosed analog to digital signal processors, the integrator of the delta modulator is preset to prevent overshoot. This improvement requires a simple circuit called an increment/decrement circuit that monitors the digital output of the standard analog to digital converter for changes. If the digital output of the converter shows an increase from the prior output, then the increment/decrement circuit operates a switch to preset the integrator of the delta modulator to minus one-half the resolution of the standard converter. Conversely, if the digital output of the converter shows a decrease, the increment/decrement circuit operates a switch to preset the integrator to plus one-half the resolution of the standard converter. By presetting the capacitor, overshooting is prevented.

A third preferred embodiment of the disclosed signal processor modifies the time constant of the delta modulator's integrator circuit is used to more quickly charge the capacitor of the delta first converter, enabling a relatively quick and approximation of the quantization error. Then, the delta modulator's rate control circuit slows the rate of charging of the capacitor, allowing ever increasing resolution of the delta modulator, allowing virtually unlimited resolution.

BRIEF DESCRIPTION OF THE DRAWINGS

FIG. 6 is a detailed schematic of the integrator used in the delta modulators disclosed in FIG. 5.

FIG. 7 is a detailed schematic of the increment/decrement circuit 214 shown in FIG. 5.

DETAILED DESCRIPTION OF THE PREFERRED EMBODIMENT

Figure 3:
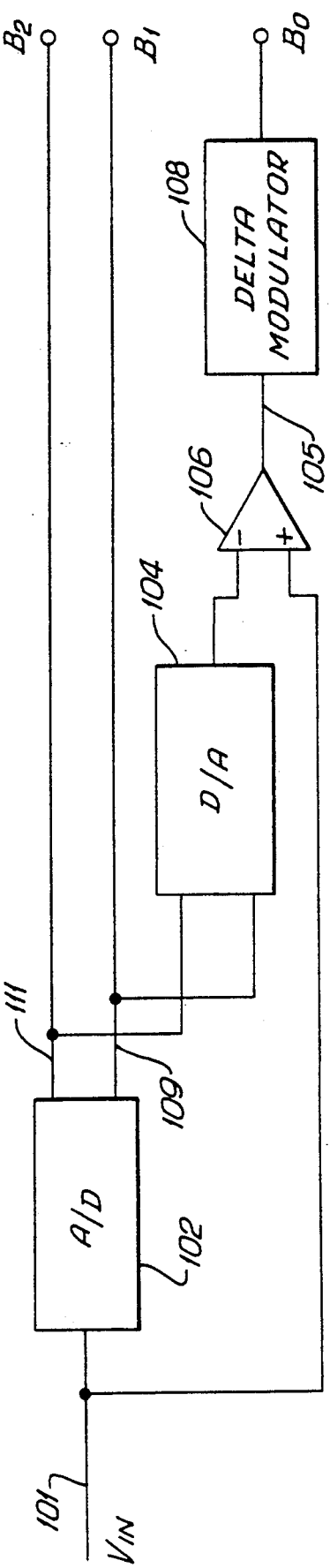
FIG. 3 is a block diagram of a first embodiment of an analog to digital signal processor for the disclosed invention.

FIG. 3 shows a first embodiment 100 of the inventive analog to digital signal processor. An input analog voltage labelled $v_{in}$ is applied to both an analog to digital converter 102 of a known resolution and to the non-inverting input of a differential amplifier 106. The depicted analog to digital converter 102 in this embodiment has two bits of resolution $B_2$ 111 and $B_1$ 109 and supplies the two most significant bits of the processor's output. The two bit output of the converter 102 is also supplied to a digital to analog converter 104 coupled to the inverting input of the differential amplifier 106. The output signal 105 of that differential amplifier 106 represents the quantization noise of the converter 102 due to that converter's limited two bit resolution of the converter 102.

The analog to digital converter 102 can be any of the standard types such as a flash, a successive approximation, a dual slope or an integrating digital to analog converter. The digital to analog converter can be any of the standard types such as a 4 quad multiplying, a multiplying or a R-2R converter. Further, if only one bit of resolution is desired for converter 102, a comparator may be used in the place of the converter.

Figure 1:
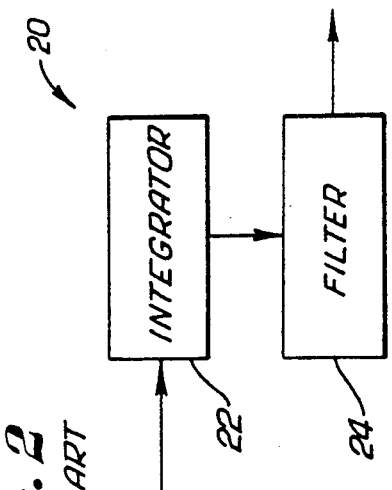
FIG. 1 is a block diagram of a prior art delta modulator.

The error signal 105 is supplied to a standard delta modulator 108 such as the type of delta modulator shown in FIG. 1. The least significant bit of the processor's 100 output $B_0$ is the delta modulator output. It should be noted that this least significant bit output $B_0$ is a serial stream of pulses representative of the quantization noise of the converter 102. It should also be understood that the clock signals for the converters 102 and 104 and the delta modulator 108 have been omitted for clarity. In the preferred version of this embodiment 100, the clock rate for the delta modulator should be equal to or greater than the clock rate for the converters 102 and 104. Alternatively, the clock rate for the delta modulator 108 can be equal to two or three times the clock rate for the converters 102 and 104, allowing the use of an accumulator (not shown) to create parallel delta bits of data.

Figure 2:
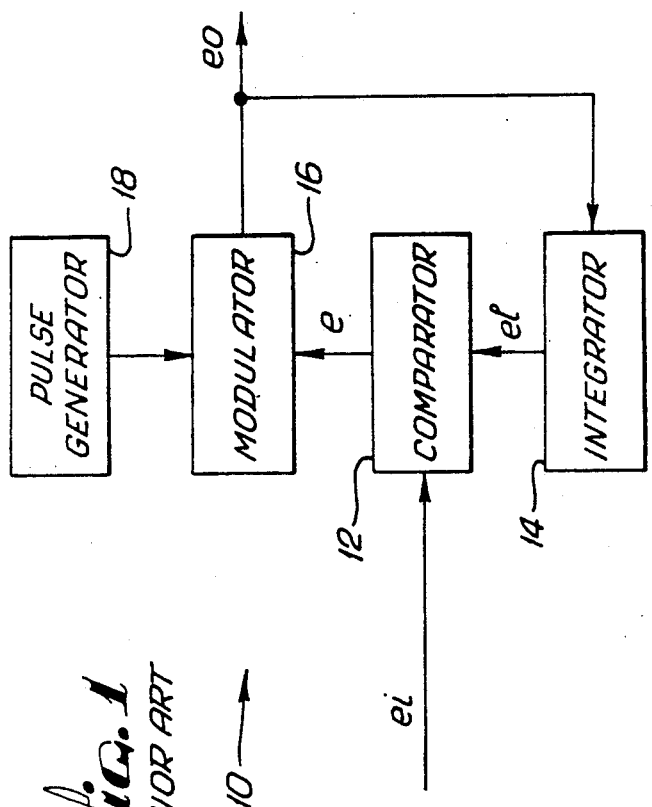
FIG. 2 is a block diagram of a prior art circuit used for converting the output of a delta modulator back into an analog signal.
Figure 4:
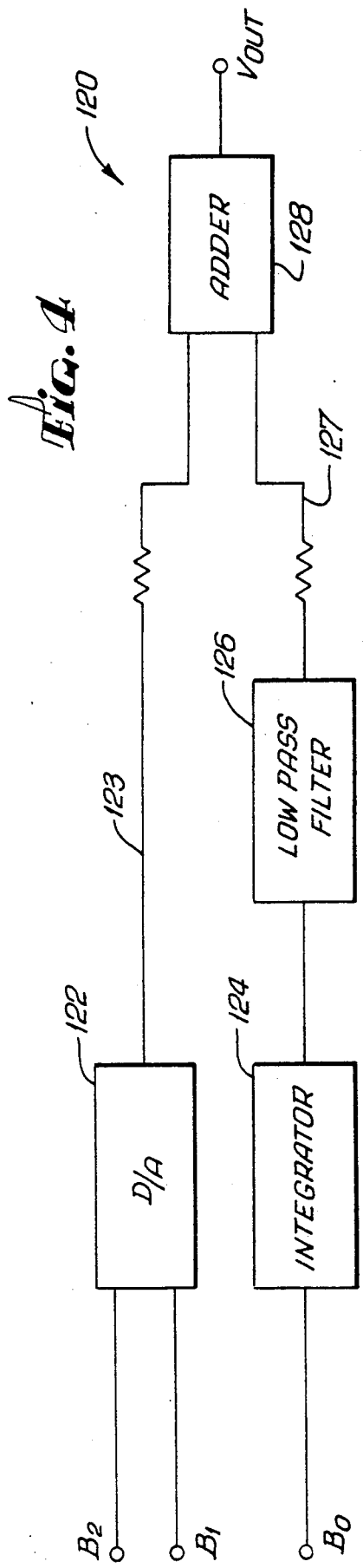
FIG. 4 is a block diagram of a digital to an analog signal processor that is compatible with the processor disclosed in FIG. 3.

FIG. 4 shows a digital to analog converter 120 for use with the analog to digital signal processor 100. The two most significant bits $B_2$ and $B_1$ are supplied to a standard digital to analog converter 122 having two bits of resolution. The converter 122 may be of the same type as used for the converter 104 shown in FIG. 3. The least significant input bit $B_0$ is supplied to an integrator 124 such as that shown in FIG. 2 and is then filtered through a low-pass filter 126 such as that shown in FIG. 2. The output 123 of the converter 122 and the output 127 of the filter 126 may then be added by an analog adder 128 to supply a reconstructed analog output signal $v_{out}$ that is approximately equal to the original input signal $v_{in}$. Again it should be noted that the clock signals have been omitted and a faster clock should preferably be applied to the delta modulator.

A principal advantage of this embodiment 100 over the prior art delta modulators is this circuit responds more quickly to gross changes in the analog input signal than the standard delta modulator. The signal processor's 100 digital representation of the input voltage $v_{in}$ will be within 12.5% of the actual instantaneous voltage as quickly as the first converter 102 reacts; i.e., the processor has an almost instantaneous resolution of two bits. However, unlike most standard 2 bit analog to digital signal processors, the inclusion of a delta modulator provides a relatively high degree of resolution.

Although the delta modulator provides a high degree of resolution, it will not reach the desired value of the quantization error for a significant period of time (a period dependent upon the period of the pulse train supplied by the pulse generator). However, that delay in providing the highly accurate representation caused by the delta modulator's slow response time may not be important. In systems such as audio or video equipment, the listener's ear or the viewer's eye cannot detect fine details in rapid, gross changes of the input information. Thus, the quick two bit approximation of the actual analog input voltage obtained by the foregoing embodiment may yield a result that is acceptable to the human ear or eye. If a higher degree of instantaneous resolution is desired, an analog to digital converter and a digital to analog converter having more bits of resolution may be used in place of converters 102, 104 and 122.

The embodiment of the signal processor 100 of FIG. 3 is prone to providing a digital representation that is higher than the actual output voltage when bits $B_2$ and $B_1$ increase. Similarly, the embodiment of FIG. 3 is prone to providing a digital representation that is less than the actual output voltage when bits $B_2$ and $B_1$ decrease. Such inaccurately high or low digital representations are called overshoot.

Figure 5:
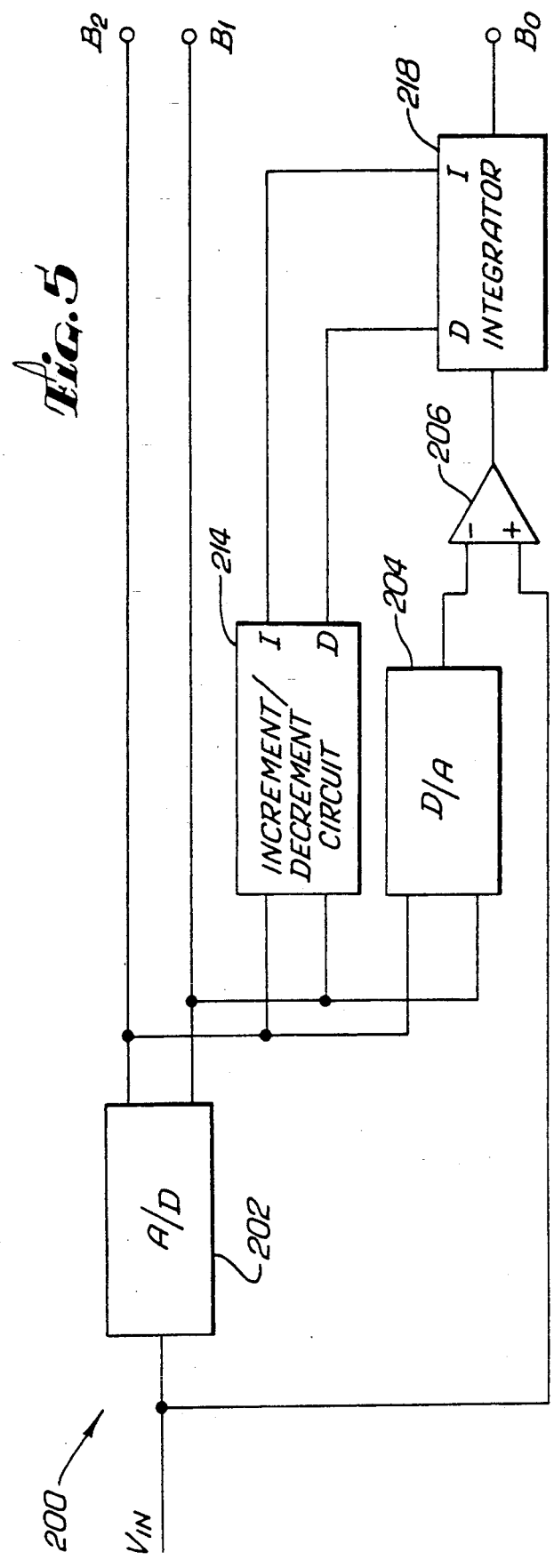
FIG. 5 is a block diagram of a second embodiment of an analog to digital signal processor for the disclosed invention that prevents overshoot.

The embodiment 200 of FIG. 5 prevents overshooting by presetting the integrator 218 (FIG. 6) in the delta modulator 208. (The clock signals to the converters and modulators have again been eliminated for the purpose of clarity). An analog to digital converter 202, a digital to analog converter 204, a differential amplifier 206 and a delta modulator 208 operate in a manner that is quite similar to the manner of operation of the corresponding parts of the embodiment 100 of FIG. 3 operates. However, the circuit includes an increment/decrement circuit 214 and a special integrator 208 (FIG. 6) that has been substituted for the standard integrator (not shown) used in the delta modulator of the embodiment 100.

The integrator 218 shown in FIG. 6 has circuitry to allow the capacitor 2184 of the integrator to be preset. In the integrator 218, a standard differential amplifier 2181 is coupled with a capacitor 2184 in a feedback circuit to integrate the input voltage $e_i$ along with an input resistor 2186. The presetting of the capacitor 2184 is controlled by an increment signal I or a decrement signal D supplied from the increment/decrement circuit 214 to analog switches 2188 and 2190 and supplied through nor gate 2189 to analog switch 2192 and through inverter 2193 to analog switch 2194. These switches may be ordinary CMOS analog switches such as 74HC4316 switches.

When the increment/decrement circuit detects that the output of the converter 202 has increased, switch 2194 opens and switches 2188 and 2192 close to preset the integrator 2180 to $-v_r$. Conversely, when the increment/decrement circuit 214 detects that the output of the converter 202 has decreased, sWitch 2194 opens and switches 2190 and 2192 close to preset the capacitor 2184 of the integrator 218 to $+v_r$.

Optimally, $v_r$ should be chosen to be one-half of the resolution of the analog to digital converter 202. Thus, in the case shown where the resolution is two bits (or 25%), then $v_r$ should be one-eighth of the maximum full scale input voltage $V_{in}$, (referred to hereafter as $V_{fullscale}$).

By choosing $v_r$ to be one-half of the resolution of the converter 202, the modulator is prevented from overshooting the input signal. For example, suppose the input voltage $V_{in}$ increases from 13% of $V_{fullscale}$ to 53% of $V_{fullscale}$ prior to that increase, the output of the delta modulator should represent 0.5% of $V_{fullscale}$ the difference between the digital representation of $B_2B_1$ and the actual input voltage. When $V_{in}$ increases from 13% to 53%, $B_2B_1$ changes from 00 to 10, which has a value of 62.5% of $V_{fullscale}$, or an overshoot of 9.5%. Without presetting the capacitor, the output of the delta modulator would still represent 0.5% of $V_{fullscale}$ due to the slow response time of the delta modulator. The combined overshoot would be 10%.

However, the increment/decrement circuit 214 detects an increment, causing switch 2188 to close. The closing of switch 2188 forces the capacitor 2184 and therefore the output of the integrator 218 to $-v_r$, i.e. the integrator has been preset to $-v_r$. As a result of the integrator being preset to $-v_r$, the integrator will cause the delta modulator to eliminate the overshoot. Instead, the delta modulator will provide an undershoot of 3.0% in this instance. Eventually, the delta modulator will compensate for the undershoot by correcting its output to represent the actual quantization error of the analog to digital converter.

The details of the increment/decrement circuit 214 of FIG. 5 are shown in FIG. 7. The increment/decrement circuit comprises two exclusive or gates 2142 and 2144, an or gate 2149, a latch 2146, such as an 74HC174 and a comparator 2148 such as an 74HC85. The exclusive or gates 2142 and 2144 and the or gate 2149 cooperate to create a strobe signal whenever one or more of the $B_2$ and the $B_1$ bits change. The values of resistors $R_1$ 2141 and $R_2$ 2143 and the Capacitors $C_1$ 2145 and $C_2$ 2147 should be selected to have a time constant sufficiently long so that the strobe signal will properly operate the latch 2146. Alternatively, latch 2146 could be clocked, alloWing for the elimination of gates 2142, 2144 and 2149, resistors 2141 and 2143, and capacitors 2145 and 2147. A decrement signal D goes high approximately simultaneously with the strobe signal if the new state of these two bits represents a number less than the prior state. The increment signal 1 becomes high if these two bits represent a number greater than the prior number. Shortly after either signal becoming high the strobe signal causes the latch to store the new values of $B_2$ and $B_1$ so that the increment and the decrement signals return to a low state.

It will be readily understood by those of ordinary skill that the signal processor 200 described in FIG. 5 can be readily adapted to have more bits of parallel resolution just as the embodiment 100 can be modified. The increment/decrement circuit 214 must be modified so that the comparator 2148 compares the latched value of the additional bits with the current value of the additional bits. Also, those of ordinary skill will also readily understand that an additional resistor, an additional capacitor, an additional exclusive or gate and an additional input to or gate 2149 will be needed to create the strobe signal. Further, those of ordinary skill in the art will also understand how to use the strobe signal to synthesize a clock signal.

The embodiment of the analog to digital signal processor of FIG. 5 requires a specialized circuit for converting the digital representation back to the analog signal. The two most significant bits $B_2$ and $B_1$ are supplied to a two bit resolution standard digital to analog converter and to an increment/decrement circuit that is identical to the circuit shown in FIG. 7. The least significant bit of the output, $B_0$, is coupled to the input of an integrator of the type shown in FIG. 6. The increment/decrement circuit 214 is also coupled to the switches of the integrator for presetting the integrator's capacitor in the manner described above. Preferably, the integrator should be frequency limited to eliminate noise from the modulator. The output of the integrator is then added by an analog adder circuit to the output of the digital to analog converter to reconstruct the input voltage. Those of ordinary skill in the art will also understand how to modify this type of digital to analog signal processor if the number of parallel bits of the input data are either increased or decreased.

Figure 8:
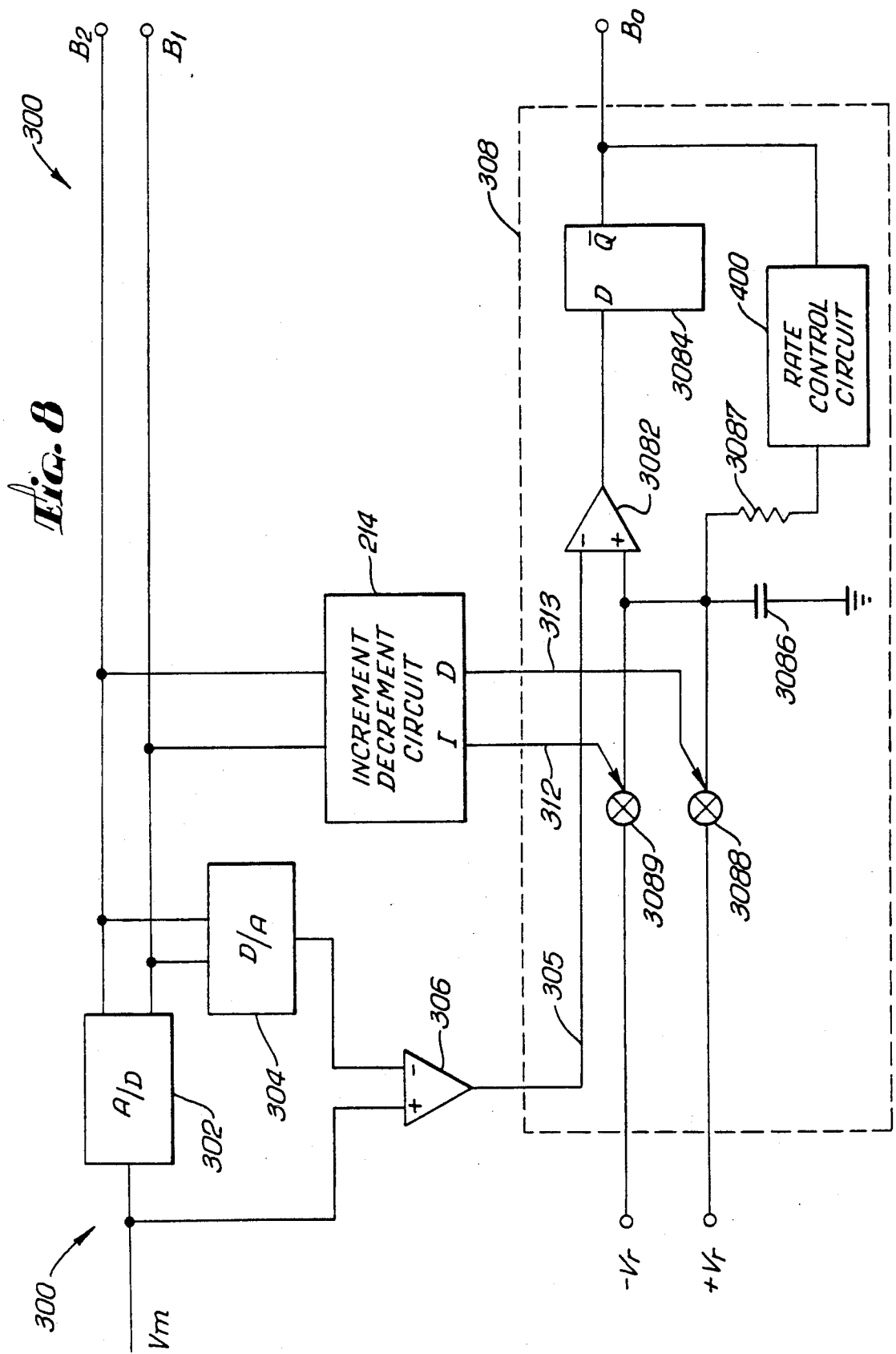
FIG. 8 is a block diagram of a third embodiment of an analog to digital signal processor having a greater resolution than the other two embodiments.

A still further improved embodiment 300 of the embodiment 200 is shown in FIG. 8. (Again, all clock signals have been omitted for the purpose of clarity). A standard analog to digital converter 302 having two bits of resolution converts the input analog voltage $v_{in}$ into the two most significant bits of the digital representation, $B_2$ and $B_1$. These two most significant bits are also coupled to an increment/decrement circuit 214 of the type shown in FIG. 7 and to a standard digital/analog converter 304. The output of the digital to analog converter 304, which represents a limited resolution version of the analog input signal $v_{in}$, is supplied to the inverting input of an differential amplifier 306. The input voltage $v_{in}$ is applied to the non-inverting input of the differential amplifier 306. Thus, the output of the differential amplifier 306 provides as its output a quantization error signal 305. This quantization error signal 305 exists due to the limited two bit resolution of the analog to digital converter 302. The quantization error signal 305 and a increment signal I 312 and a decrement signal D 313 are supplied to a modified delta modulator 308. The delta modulator 308 comprises a comparator 3082, a D flip-flop 3084, a rate control circuit 400, a resistor 3087, a signal capacitor 3086, and analog switches 3088 and 3089. The resistor 3087 and the signal capacitor 3086 comprise an integrator or accumulator and should be selected such that the integrator reaches 12.5% of the input voltage in $\frac{1}{2}$ of a clock cycle of the D flip-flop. Further, the clock rate of the D flip-flop should preferably be equal to or greater than the rate of the clock signal (not shown) applied to the converters 302 and 304. Alternatively the clock rate for the D flip-flop may be two or three times the clock rate of the clock signal for the converters, allowing the use of an accumulator (not shown) to create parallel delta modulator bits.

Analog switches 3088 and 3089 preset the signal capacitor 3086 of the integrator in the same manner as switches 2188 and 2190 of preset the integrator 208 of the embodiment of FIG. 6. For example, where the input voltage causes the two most significant bits $B_2B_1$ to increase, the signal capacitor 3086 is preset to $-v_r$, while if the two most significant bits decrease, the signal capacitor 3086 is preset to $+v_r$.

The operation of the remainder of the delta modulator 308 will now be explained. The signal capacitor 3086 is preset by the closing of one of the analog switches when the two most significant bits change. The comparator 3082 compares the voltage across the signal capacitor 3086 with the quantization error signal 305, representing the difference between the actual input voltage and the digital representation of $B_2$ and $B_1$. If the error signal is less than the voltage across the capacitor 3086, the output of the comparator 3082 becomes high and the output Q inverted of the flip-flop 3084 becomes low at the next clock pulse. Thus, the least significant bit, $B_0$ becomes low. In response to Q inverted ($B_0$) becoming low, the rate control circuit 400 causes the voltage across the signal capacitor 3086 to decrease in a manner that will be explained below. If the error signal is greater than the voltage across the capacitance, the rate control circuit 400 responds in the opposite manner to cause the voltage across the signal capacitor 3086 to increase in a manner that will be explained below.

The rate control circuit 400 charges or discharges the signal capacitor 3086 initially at a high rate after a change in the two most significant bits so that the least significant bit $B_0$ will provide a quick approximation of the error signal to a compatible digital to analog processor described below. As time continues, the rate control circuit 400 slows the rate of charging as the signal capacitor 3176 provides an increasingly accurate representation of that error signal to the appropriate digital to analog signal processor discussed below. Thus, the rate control circuit 400 charges the signal capacitor 3086 quickly to attain a rough approximation of the actual error signal and then more slowly to attain a more accurate approximation of the signal.

Figure 9:
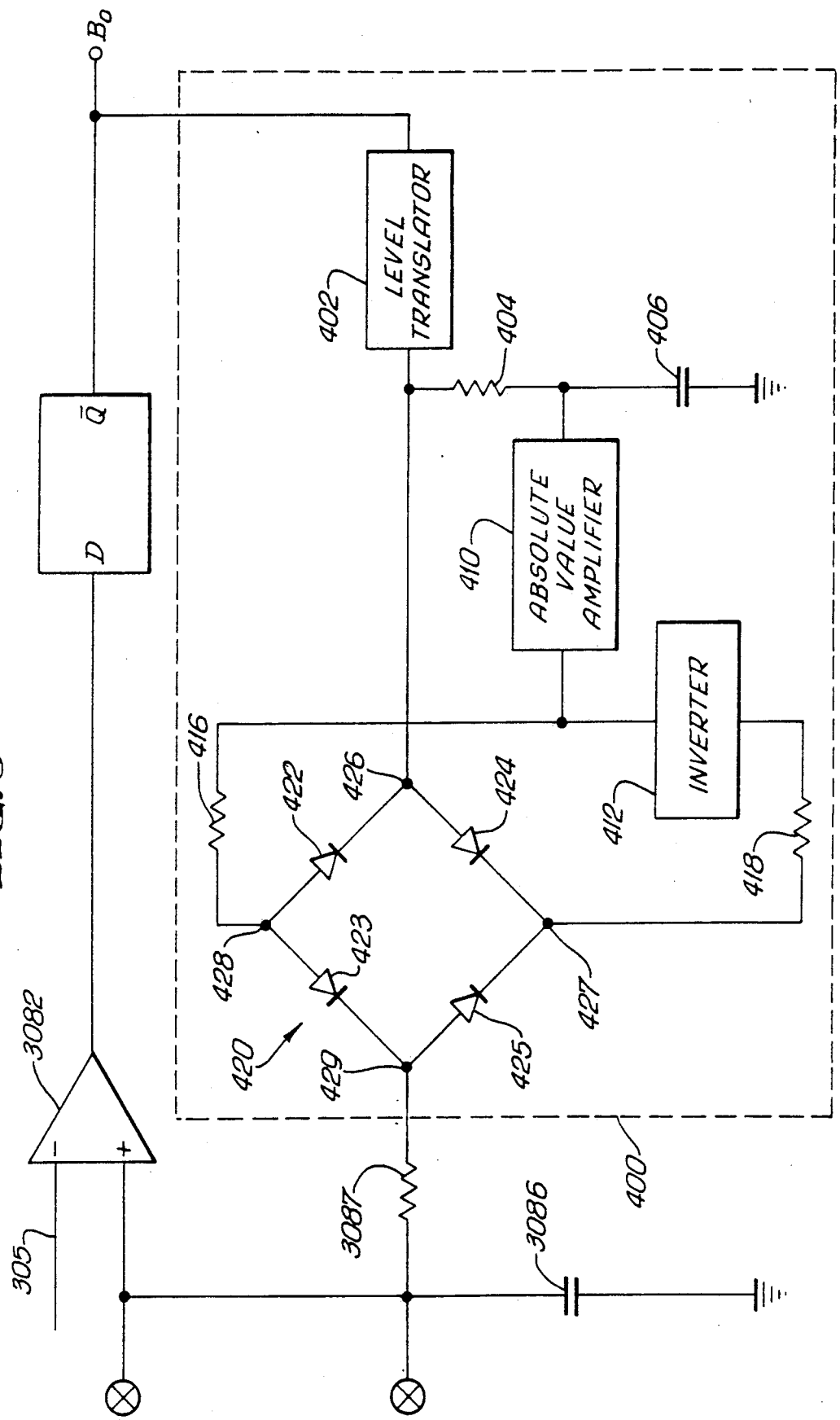
FIG. 9 is a detailed schematic of the rate control circuit 400 shown in FIG. 8 together with certain additional components of the embodiment shown in FIG. 8.

FIG. 9 shows a detailed schematic of the rate control circuit 400 and certain additional components of the third embodiment 300. The least significant bit $B_0$ of the signal processor's output 300 is coupled to the input of the rate control circuit 400 through a level shifter 402 that translates the TTL level output at $B_0$ to $+/-5$ volts. A resistor 404 and a rate capacitor 406 form a rate averaging circuit. The output of the rate averaging circuit is coupled to an absolute value amplifier 410, which in turn is coupled to an inverter 412. The output of the level shifter 402 is also coupled directly to one node 426 of a diode bridge 420. The absolute value amplifier 410 is coupled through the matched resistors 416 and 418 and the inverter 412 to two other nodes 427, 428 of the diode bridge 420. The resistance of resistors 404, 416 and 418 should be similar to the resistance of resistor 3087 and the capacitance of the rate capacitor 406 should be approximately equal to the capacitance of the signal capacitor 3086.

The diode bridge 420 comprises diodes 422–425 and acts to steer the appropriate charging current to the signal capacitor 3086. For example, assume that analog switch 3088 has just closed, forcing the voltage across the signal capacitor 3086 to $-v_r$. In this example, the voltage across the signal capacitor 3086 is less than the error signal, so $B_0$ is high and the output of the level shifter 402 is approximately 5 volts. Thus, the voltage at the node 426 of the diode bridge is much greater than the voltage at an output node 429 (which will be approximately $-v_r$). Further, due to the averaging effect of the rate capacitor 406, the node 428 will be less than the voltage at the node 426 but greater than the voltage at the node 429. Due to the presence of the inverter 412, the voltage at the node 427 is less than the voltage across the signal capacitor 3086 or at the node 426. Thus, diodes 423 and 424 will conduct, charging the signal capacitor 3086 until the voltage across the signal capacitor is greater than the voltage of the error signal 305.

If the voltage across the signal capacitor 3086 is greater than the quantization error signal 305, the output of the comparator 3082 becomes high and the least significant bit $B_0$ becomes low. With the least significant bit changing to low, the output of the level shifter 402 switches to minus 5 volts, turning off diodes 423 and 424. Diodes 422 and 425 will start to conduct, driving the voltage across the signal capacitor 3086 more negative. When, the voltage across the signal capacitor 3086 becomes less than the error signal 305, the output $B_0$ will again go negative and the process described in the previous paragraph will repeat.

As the voltage across the signal capacitor 3086 approaches the voltage of the quantization error signal 305, the output $B_0$ will start to toggle between 1 and 0 at a frequency equal to the clock frequency of the D flip-flop 3084. Having the output $B_0$ toggle forces the voltage across the rate capacitor 406 to approach 0 due to the rate capacitor's averaging effect. As the voltage across rate capacitor 406 approaches 0, the diode bridge circuit 420 of the rate control circuit will provide decreasing charging current to the capacitor 3086 absent a change in the input signal. Thus, the initial large charging current diminishes rapidly as the voltage across the signal capacitor 3086 approaches the voltage of the quantization error signal 305. This diminishing charging rate provided by the rate control circuit 400 allows a delta modulator to have an extremely high degree of resolution—the principle limit on the resolution being the resolution of the comparator 3082.

The output digital representation of the third embodiment 300 will also eliminate the need for dithering to avoid quantization noise of low level signals or slowly changing signals. Low level signals are processed purely by the disclosed embodiment of the delta modulator and not by the normal analog to digital converter in this signal processor. The analog to digital converter disclosed herein does not produce the type of quantization noise common in typical delta modulators or in standard analog to digital converters due to the absence of gates closing or opening in that situation. Further those of ordinary skill in the art will readily understand how to change the processor to increase the number of bits of parallel resolution for the processor 300.

Figure 10:
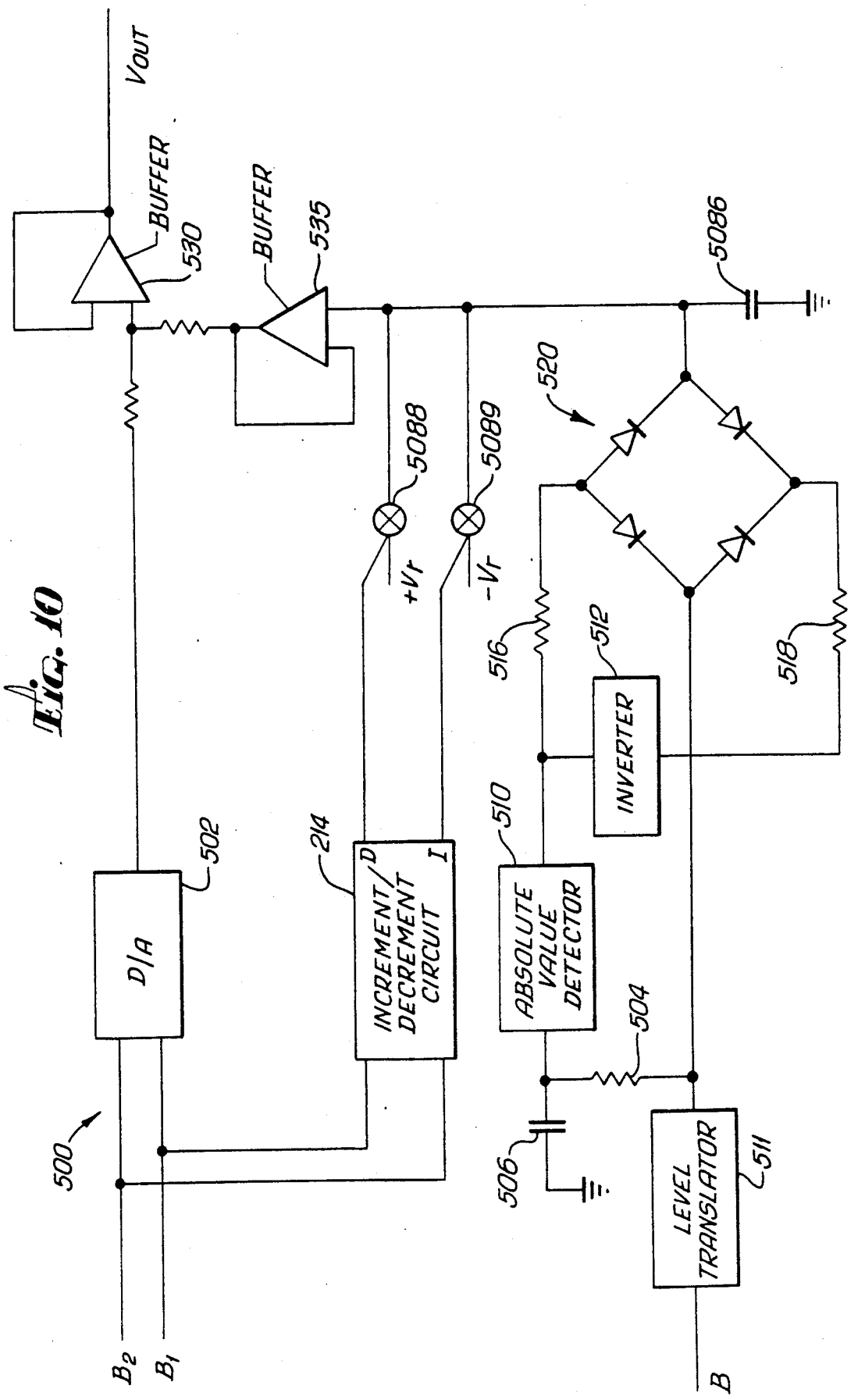
FIG. 10 is a schematic of a digital to analog signal processor that is compatible with the third embodiment shown in FIG. 8.
Figure 9:
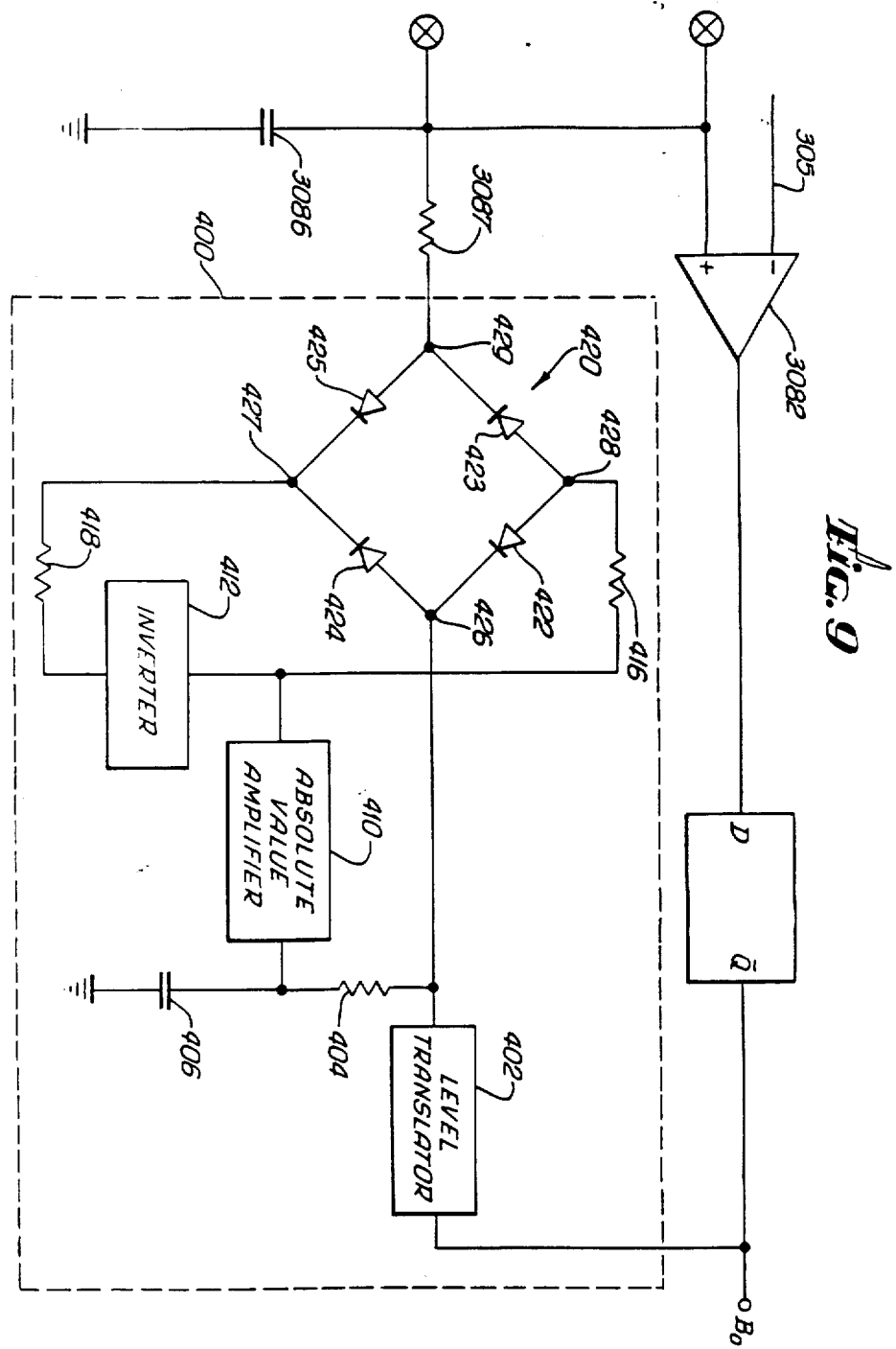

FIG. 10 shows the appropriate digital to analog signal processor 500 that should be used with the processor shown in embodiment 300. The two most significant bits $B_2$ and $B_1$ are applied to a standard digital to analog converter 502 having a resolution of two bits. The resultant analog signal 503 is applied to one input of a summing amplifier 530. The least significant bit $B_0$ is applied to a rate control circuit 400 that is identical to the rate control circuit described in FIG. 9. The two most significant bits are also applied to the increment/decrement circuit 214 of the type described in FIG. 7. The increment and decrement signals of the circuit 214 control analog switches 5088 and 5089 for applying either $+v_r$ or $-v_r$ in the appropriate manner to preset a signal capacitor 5086 in the same manner that the signal capacitor 3086 is preset.

Serial input bit $B_0$ is applied to a level translator 511. Diode bridge 520 operates in the same manner that the diode bridge 420 operates to steer current and an inverter 512, an absolute value detector 510, resistors 514, 516, and 504, a rate capacitor 506 and a signal capacitor 5086 operate in the same manner as the corresponding parts operate in the rate control circuit 400 shown in FIG. 9. The voltage across the signal capacitor 5086 is applied to the summing amplifier 530 through a buffer amplifier 535. The output of that summing amplifier 530 provides an analog output signal $V_{out}$ that accurately represents the analog input signal within the tolerances of the amplifiers and comparator and with an allowance for the time delay of the circuit components. It should be noted that all of the capacitors, resistors, and diodes used in the digital to analog signal processor 500 should be selected to match the corresponding components used in the compatible analog to digital signal processor 300.

Although the specific embodiments described above represent analog to digital and digital to analog signal processors having three bits of resolution, those of ordinary skill in the art understand that additional bits can be added by including an standard converters with greater resolution. More bits increases the system's cost but also increases the speed at which a highly accurate representation of the signal is attained.

It will further be understood by those of ordinary skill in the art that many other alternative embodiments of the disclosed system can be built with double integration delta modulators, delta sigma modulators, or high information delta modulators. The scope of the invention is of course defined by the claims.

I claim:

1. A signal processor for converting a received analog input voltage into a digital representation, the processor comprising:
   a first analog to digital converter coupled to receive the analog input voltage and providing a first part of a digital output representation of a predetermined resolution of the analog input voltage;
   a resolution error detector responsive to the analog input signal and the first part of the digital output representation and providing a difference signal proportional to the difference between the input analog voltage and the first part of the digital output representation; and
   a delta modulator having an output comprising a second part of the digital representation, the delta modulator receiving as the input said difference signal, wherein the output of the signal processor comprises the output of the analog to digital converter and the output of the delta modulator.

2. The signal processor of claim 1, wherein the resolution error detector comprises:
   a digital to analog converter for converting the output of the first converter back into an analog resolution signal; and
   a difference detector detecting the difference between the resolution signal and the input analog signal, thereby creating the difference signal.

3. The signal processor of claim 1,
   wherein the delta modulator includes an integrator and
   wherein the signal processor further comprises:
   a circuit detecting if the output of the first converter has increased or decreased; and
   a preset circuit that forces the integrator to a first limiting voltage if the output of the converter has increased and forces the integrator to a second reference voltage if the output of the converter has decreased.

4. The signal processor of claim 3, wherein the first limiting voltage is the negative of the second limiting voltage.

5. The signal processor of claim 4, wherein the second limiting voltage is approximately one-half the voltage resolution of the first converter.

6. The signal processor of claim 1, wherein the delta modulator is a double integrator delta modulator.

7. The analog to digital signal processor of the type described in claim 1, wherein the delta modulator is a sigma delta modulator.

8. In an analog to digital signal processor providing as first output a digital representation of a limited resolution of a predetermined number of bits of an analog input signal, wherein the improvement comprises:
   a delta modulator responsive to the analog input signal and the first output producing as a second output a digital signal representative of the difference between the limited resolution of the first output and the actual analog input signal.

9. The analog to digital processor of claim 8, wherein the delta modulator includes an accumulator capable of accumulating at variable rates in response to a control, and the delta modulator further includes a rate control controlling the rate of accumulation in response to the output of the delta modulator.

10. The analog to digital signal processor of claim 9, wherein the delta modulator further includes a presetter responsive to an increase or a decrease in the digital representation to inhibit overshooting in the accumulator.

11. The analog to digital processor of 9, wherein the resolution of the analog to digital converter is two bits.

12. In a delta modulator including an integrator having a controllable rate of integration coupled to integrate a first signal, a comparing device coupled to compare an analog input signal to the integral of the first signal and a modulator adapted to modulate a pulse train based upon the output of the comparator, wherein the improvement comprises:
  a rate control circuit responsive to the output of the modulator and the input signal to cause the integrator to integrate the first signal quickly immediately following a change grater than a predetermined size in the input signal and to then subsequently slow the rate of integration.

13. In the delta modulator of claim 12, wherein the rate control circuit comprises:
  a level shifter responsive to the first signal of the delta modulator;
  an absolute value integrator responsive to the level shifter;
  an inverter responsive to the absolute value integrator;
  a current steering circuit responsive to the level shifter, the absolute value integrator and the inverter for controlling the rate of integration of the integrator.

14. A signal processor for converting a digital input including both parallel digital data and serial difference data to an analog output signal comprising:
  a parallel digital to analog converter for converting the parallel data to a first analog voltage;
  a first accumulator responsive to the serial difference data for providing a second analog voltage; and
  means for adding the two analog voltages to create the output analog voltage.

15. The signal processor of claim 14, wherein the accumulating means comprises a delta demodulator.

16. The signal processor of claim 15, wherein the processor includes:
  increment/decrement means for detecting if the parallel input data has increased or decreased; and wherein
  the accumulator includes:
  voltage storage means for storing a voltage and switching means operative in response to an increase in the data for storing a first voltage in the voltage storage means and for storing a second voltage in the voltage storage means in response to a decrease.

17. The signal processor of claim 16, wherein the serial data wherein the accumulator includes:
  high resolution converter means responsive to at least part of the input digital representation for providing an initial rough approximation of the serial data after a change greater than a predetermined magnitude in at least part of the input digital representation and for subsequently providing a higher resolution approximation of the serial data.

18. The signal processor of claim 17, wherein the accumulator accumulates at variable rates and the high resolution means comprises:
  a second accumulator means for accumulating the serial data;
  an absolute value detector responsive to the accumulated serial data;
  an inverter responsive to the absolute value of the accumulated serial data;
  means operative in response to the absolute value and the inverted absolute value for controlling the rate of accumulation of the accumulator.

19. A signal processor for converting an input analog signal into a digital representation, the signal processor comprising:
  an analog to digital converter of a first predetermined conversion rate producing a first digital representation of the input analog signal, wherein said digital representation has a predetermined quantization error; and
  a second analog to digital converter having a second, slower speed and producing a second digital representation to the amount of the quantization error of the first converter.

20. A signal processor for converting a digital representation of a first analog signal to an output analog signal, the digital representation including both parallel data and serial data, wherein the signal processor comprises:
  a first digital to analog converter converting parallel digital data into a second analog signal proportional to the digital representation, the second analog signal having a first resolution;
  a second digital to analog converter responsive to the serial data and providing a third analog signal based upon the serial data, the second digital to analog converter having a resolution greater than the first resolution; and
  a summer responsive to the outputs of the converters and providing as an output the summation of the second and third analog signals, whereby the output of the summer is the analog output signal.

21. A process for converting an analog signal into a digital representation of that signal, the process comprising:
  converting the analog signal into a first part of the digital representation comprises of parallel data, wherein the digital representation has a predetermined quantization error and wherein the quantization error has a rate of change; and
  comparing the analog input signal with the first part of the digital representation and obtaining a second part of the digital representation representative of the rate of change of the quantization error based upon that comparison and,
  wherein the digital representation comprises the first and second parts of the representation.

22. The process of claim 21, wherein the obtaining of the second part of the digital representation comprises integrating the quantization error.

23. The process of claim 22, wherein the obtaining of the second part of the digital representation further includes:
  determining if at least a part of the first part of the digital representation has increased or decreased from a prior digital representation; and
  presetting the integration to a first limit if the first part of the digital representation increased and presetting said integration to a second limit if the first part of the digital representation decreased.

24. The process of claim 23, wherein the obtaining of the second part of the digital representation includes controlling the rate of integration from a faster rate to a slower rate if the first part of the digital representation remains unchanged.

25. A process for converting a digital representation of an analog signal to the analog signal, wherein the digital representation contains first data having a predetermined quantization error changing at a rate and second data representative of the rate of change of the quantization error, the process comprising:
  converting the first data into a first analog signal proportional to the first data;

converting the second data into a second analog signal proportional to the amount of the quantization error; and after performing the two conversion steps, mixing the first analog signal and the second signal, whereby the desired analog signal is obtained.

26. The process of claim 25, wherein the first data is parallel data and the second data is serial data.

27. The process of claim 25, wherein the converting of the second part comprises:
integrating the second data.

28. The process of claim 27, wherein the converting of the second data further includes:
determining if the first data has increased or decreased; and
presetting the integrating to an initial desired value if the first data has increased and presetting the integrating to a second desired value if the first data has decreased.

29. The process of claim 28, wherein the converting of the second data is not completed until the converting of the first data has been completed and the converting of the second data further includes:
controlling the rate of integrating such that the integration initially occurs at a first rate and then diminishing the rate.

30. A signal processor for converting an analog input signal into a digital representation, the processor comprising:
a first analog to digital converter coupled to receiver the analog input signal and providing a first part of the digital output representation, the converter having a quantization error;
detector means responsive to the output of the first converter for determining if the output of the first converter has changed from a prior output of the converter; and
a second converter responsive to the input signal, the output of the first converter and the detector means to provide a second part of the digital output representation, wherein the second art of the digital representation is a function of the quantization error.

31. The processor of claim 30, wherein the second converter includes means responsive to the detector for providing an initial approximation of the quantization error immediately following changed in the output of the first converter and then providing successively more accurate approximations of the quantization error.

32. The processor of claim 30, wherein, the detector means comprises an increment/decrement circuit.

33. The processor of claim 30, wherein, the second converter includes:
means for determining the quantization error in response to the first part of the digital representation and the input analog signal; and
means for providing as the second part of the digital representation digital data representative of the rate of change of the quantization error.

34. A process for converting an analog signal into a series of digital representations of that signal, the process comprising:
converting the analog signal into a first part of the digital representation having a quantization error;
determining if the first part of the digital representation has changed since the last digital representation; and
providing a second part of the digital representation representative of the quantization error in response to the determination of the change, the input analog signal and the first part of the digital representation.

35. The process of claim 34, wherein upon the detection of a change, the second part of the digital representation is forced to a preselected value.

36. A signal processor for converting digital data comprises of at least two parts into an analog signal, the processor comprising:
a first convertor coupled to receive a first part of the digital data and to provide a first analog output signal;
a detector for determining if the first part of the data has changed;
a second converter responsive to at least a second part of the data and the detector to provide a second analog signal, the output of the second converter being a second analog signal that is preset to one of a group of predetermined levels in response to the detection of a change; and
means for mixing the two analog signals to provide a third output analog signal.

37. A process for converting digital data comprised of at least two parts into an analog signal, wherein the first and second parts of the digital have a first and second resolution respectively, the process comprising:
converting a first part of the digital data into a first analog signal;
determining if at least one of the parts of digital data has changed;
converting at least a second part of the digital data into a second analog signal, wherein the conversion to the second analog signal is forced to one of a predetermined level in response to a changed in said at least one part of the digital data.

38. The process for converting digital data of claim 37, wherein the determining of the change includes determining if said at least first part of the data has increased or decreased; and wherein the converting of said at least second part of the data includes forcing the second analog signal to a lower level if said at least first part of data has increased and forcing the second analog signal to a higher level if said first part of the data as decreased.

* * * * *

UNITED STATES PATENT AND TRADEMARK OFFICE
CERTIFICATE OF CORRECTION

PATENT NO. : 5,021,786

DATED : June 4, 1991

INVENTOR(S) : Richard C. Gerdes

It is certified that error appears in the above-identified patent and that said Letters Patent is hereby corrected as shown below:

In the Drawings, after sheet 4, insert the attached Figure 9.

Signed and Sealed this

Twenty-sixth Day of January, 1993

Attest:

STEPHEN G. KUNIN

*Attesting Officer*   Acting Commissioner of Patents and Trademarks